United States Patent
Hohn et al.

(10) Patent No.: US 9,310,538 B2
(45) Date of Patent: Apr. 12, 2016

(54) COMPOSITION FOR PRODUCING A FILTER MATERIAL FOR RADIATION, METHOD FOR PRODUCING A COMPOSITION FOR A FILTER MATERIAL, MATERIAL FOR FILTERING RADIATION, AND AN OPTOELECTRONIC DEVICE COMPRISING THE MATERIAL

(75) Inventors: Klaus Hohn, Forchheim (DE); Michael Schumann, Neu-Ulm (DE); Dirk Sossenheimer, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 150 days.

(21) Appl. No.: 13/379,257

(22) PCT Filed: Jun. 30, 2010

(86) PCT No.: PCT/EP2010/059288
§ 371 (c)(1),
(2), (4) Date: Jan. 19, 2012

(87) PCT Pub. No.: WO2011/003788
PCT Pub. Date: Jan. 13, 2011

(65) Prior Publication Data
US 2012/0104291 A1    May 3, 2012

(30) Foreign Application Priority Data
Jul. 6, 2009   (DE) .................. 10 2009 031 915

(51) Int. Cl.
*G02B 5/00* (2006.01)
*G21K 1/00* (2006.01)
*H01J 1/52* (2006.01)
*H01J 29/46* (2006.01)
*H01J 3/00* (2006.01)
*H01J 5/18* (2006.01)
*G02B 5/20* (2006.01)
(Continued)

(52) U.S. Cl.
CPC .............. *G02B 5/208* (2013.01); *C09D 183/04* (2013.01); *G02B 5/223* (2013.01); *H01L 31/0232* (2013.01)

(58) Field of Classification Search
USPC ................. 250/504 R, 505.1; 252/582, 587; 525/464; 257/E21.535; 359/885; 438/57
See application file for complete search history.

(56) References Cited

U.S. PATENT DOCUMENTS
3,620,888 A   11/1971 Buzzell
4,039,467 A   8/1977 Tucker
(Continued)

FOREIGN PATENT DOCUMENTS
CN   101472738 A   7/2009
GB   1 201 066     8/1970
(Continued)

OTHER PUBLICATIONS
The Japanese Examination Report issued on Jan. 23, 2014 for Japanese Patent Application No. 2012-518898.
(Continued)

*Primary Examiner* — Bijan Ahvazi
(74) *Attorney, Agent, or Firm* — DLA Piper LLP (US)

(57) ABSTRACT

Composition for producing a filter material for radiation includes a silicone and at least one dye dispersed in the silicone, wherein the composition has a relative transmission of less than 20% for radiation of the wavelength of 400 nm to 700 nm, and has a relative transmission of greater than 50% for radiation of the wavelength of 850 nm to 1025 nm.

9 Claims, 1 Drawing Sheet

(51) Int. Cl.
*C09D 183/04* (2006.01)
*G02B 5/22* (2006.01)
*H01L 31/0232* (2014.01)
*F21V 9/00* (2015.01)
*G02B 5/02* (2006.01)
*G02C 7/10* (2006.01)
*G02F 1/361* (2006.01)
*G03B 11/00* (2006.01)
*A61N 5/06* (2006.01)
*G01J 3/10* (2006.01)

(56) References Cited

U.S. PATENT DOCUMENTS

| 5,596,025 | A | 1/1997 | Oxman et al. | |
|---|---|---|---|---|
| 2008/0103267 | A1* | 5/2008 | Hurst et al. | 525/464 |
| 2008/0285165 | A1* | 11/2008 | Wu et al. | 359/885 |

FOREIGN PATENT DOCUMENTS

| JP | 9-132718 | 5/1997 | |
|---|---|---|---|
| JP | 11-500545 | 1/1999 | |
| JP | 2003-224292 | 8/2003 | |
| JP | 2003-262701 | 9/2003 | |
| JP | 2005-66914 | 3/2005 | |
| JP | WO 2007/149624 A1 * | 12/2007 | ............... G02B 1/04 |
| JP | 2008-009238 | 1/2008 | |
| WO | 2007/149624 | 12/2007 | |
| WO | 2008/035554 | 3/2008 | |

OTHER PUBLICATIONS

English translation of the Notification of Reasons for Refusal dated Aug. 24, 2015 of corresponding Japanese Application No. 2014-206491.

* cited by examiner ns, which is

COMPOSITION FOR PRODUCING A FILTER MATERIAL FOR RADIATION, METHOD FOR PRODUCING A COMPOSITION FOR A FILTER MATERIAL, MATERIAL FOR FILTERING RADIATION, AND AN OPTOELECTRONIC DEVICE COMPRISING THE MATERIAL

CROSS REFERENCE TO RELATED APPLICATIONS

This is a §371 of International Application No. PCT/EP2010/059288, filed on Jun. 30, 2010 (WO 2011/003788, published on Jan. 13, 2011), which claims priority of German Patent Application No. 10 2009 031 915.8, filed on Jul. 6, 2009, the entire contents of which are hereby incorporated by reference.

TECHNICAL FIELD

This disclosure relates to a composition for producing a filter material for radiation.

BACKGROUND

A very common problem in data transmission, which is effected by electromagnetic radiation for example from a transmitter unit to a receiver unit, is that disturbances caused for example by electromagnetic radiation occur in a wavelength range, which borders the wavelength range used for data transmission.

It could thus be helpful to reduce or completely avoid these disturbances.

SUMMARY

We provide a composition for producing a filter material for radiation, including a silicone, and at least one dye dispersed in the silicone, wherein the composition has a relative transmission of less than 20% for radiation of the wavelength of 400 nm to 700 nm, and a relative transmission of greater than 50% for radiation of the wavelength of 850 nm to 1025 nm.

We also provide a material for filtering radiation, obtained by curing a composition.

We also provide a method of producing a composition for a filter material including the steps of:
A) providing a silicone,
B) heating the silicone,
C) adding a dye to the silicone from B) so that a dispersion is formed,
D) mixing the dispersion from C) so that mixture is formed,
E) heating the mixture from D),
F) dispersing the mixture from E) so that a composition for a filter material is produced,
wherein the composition has a relative transmission of less than 20% for radiation of the wavelength of 400 nm to 700 nm, and a relative transmission of greater than 50% for radiation of the wavelength of 850 nm to 1025 nm.

We also provide an optoelectronic device which emits or absorbs electromagnetic radiation of a wavelength from the wavelength range of 850 nm to 1025 nm, wherein, in a beam path, the device comprises a layer or a component which comprises the material.

We also provide a composition for producing a filter material for radiation, including a silicone, and at least one dye dispersed in the silicone, wherein the composition has a relative transmission of less than 20% for radiation of the wavelength of 400 nm to 700 nm, and a relative transmission of greater than 50% for radiation of the wavelength of 850 nm to 1025 nm, and wherein the relative transmission increases rapidly and at least doubles above a wavelength of 750 nm.

DETAILED DESCRIPTION

Figure 1:
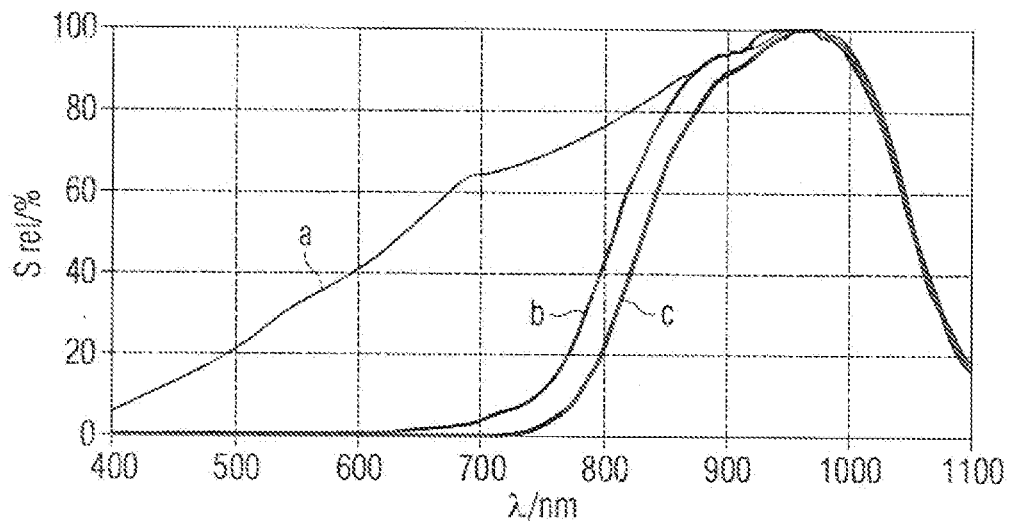
FIG. 1 shows three transmission spectra (a-c) in which in each case relative transmission ($S_{rel}$) has been plotted against wavelength ($\lambda$).

We provide a composition for producing a filter material for radiation, an optoelectronic device, which comprises this material, and a method for producing a composition for a filter material.

Our composition for producing a filter material for radiation comprises a silicone and at least one dye dispersed in the silicone, wherein the composition has a relative transmission of less than 20% for radiation of the wavelength of 400 nm to 700 nm, and has a relative transmission of greater than 50% for radiation of the wavelength of 850 nm to 1025 nm.

The relative transmission relates in this case to the maximum transmission value (100%), which is achieved in the wavelength range of 700 nm to 1100 nm.

The use of silicone as a matrix material for the dye proves to be advantageous compared to other materials. So, silicone has some technical advantages for example over epoxide resins. It is for example possible to produce silicones, which have a high degree of transparency for radiation from the infrared spectrum, 780-1400 nm, i.e., the wavelength range in which the data transmission takes place. Furthermore, compared with epoxides, silicones have a higher optical stability in particular with respect to UV light. As a consequence, the silicones have a considerably lower ageing tendency compared with epoxide resins. The use of soft silicones reduces for example the thermo-mechanical stress upon the device, on which the silicone is applied, as a result of which degeneration and ageing of the device are reduced. A further advantage of silicones is that they cover a broad permanent-temperature-usage range. The permanent-temperature-usage range lies for standard silicones approximately in the range of −40 to +150° C., but can also be extended to for example −70 to +200° C. through the use of special silicones. These special silicones can be purified for example by distillation, whereby the proportion of volatile silicones is for example less than 2 wt. %. However, the temperature usage range can also be increased for example by the addition of stabilizers or by fluorination of the side groups.

In contrast to epoxide casting resins, silicones are less moisture-sensitive during processing or curing. This permits for example simpler processing of the silicone. Compared with epoxides, silicones exhibit a more favorable, lower moisture absorption behavior.

By suitable selection of the dye, fit is possible to filter out the wavelength range of 400 nm to 700 nm to a large extent. Whereas the composition has a transmission of greater than 50% for a wavelength range of 850 nm to 1025 nm. The values for relative transmission relate in this case to the maximum transmission value (100%), which the composition has in a wavelength range of 700 nm to 1100 nm. It is thus possible to protect for example detectors which are intended to detect electromagnetic radiation from the wavelength range of 850 nm to 1025 nm, from disturbing radiation such as natural light, for example by a coating of the radiation entry window with the composition.

In this case, the dye is present in dispersed form in the silicone. Therefore, it does not have to be dissolved in the silicone, preferably it is present in a non-dissolved form in the silicone. For example, it can be present as dye particles in the silicone. As a result, the dye has a diffuser effect in the composition. By virtue of the fact that the dye is present in a non-dissolved form in the silicone, very thin layers (<0.1 µm) of the composition have only a low filter action.

The dye may be distributed homogeneously in the silicone.

The homogeneous, uniform distribution of the dye in the silicone ensures, on the one hand, a uniform visual impression of the composition, but at the same time is also a prerequisite for the fact that a layer, which is formed from the composition, has a consistent absorption characteristic over its entire surface. The homogeneous distribution is thus also a prerequisite for the reproducibility in the production of this type of layer from the composition.

However, a homogeneous particle distribution does not mean that the composition must necessarily be agglomerate-free and aggregate-free. "Homogeneous" means that the dye particles can be individual particles and agglomerates, or mixtures of both. They are uniformly distributed in a sufficiently large volume element such that an observer is able to appreciate visual and microscopic color homogeneity. It should not be possible to detect any inhomogeneities on account of incident light or transmitted light.

As a consequence, a flawless optical function is achieved in the device. The dye particle proportion, and size, shape and distribution of the particles have a direct influence upon the near field and far field behavior of optoelectronic transmitter elements or upon their detector sensitivity.

Homogeneity of the particle distribution and the particle size can be determined by a light microscope. For this purpose, the composition can be applied for example to a glass plate and can be covered with a further glass plate.

To achieve an appropriate homogeneous distribution, it is necessary to follow a certain sequence of method steps, which are explained in connection with the production method. Furthermore, a small particle size is advantageous.

However, alternatives are also feasible in which the dye is present in a partially dissolved form. This would be the case, for example, if the dye has siloxane-containing side chains. By virtue of these, the dye can interact with the silicone so that a solution of the dye in the silicone is obtained.

The dye may be present in the silicone in dispersed form as particles having a size of less than 200 µm.

In this regard, particles are to be regarded as being individual particles or individual particle agglomerates. They should be smaller than 200 µm, wherein in the case of spherical, ball-shaped particles or non-uniformly formed so-called "flakes" or "platelets," this refers to the maximum diameter and not the average sizes from distribution curves. In the case of needle-shaped particles, this should refer accordingly to the maximum needle length. Since this does not relate to average sizes, the particle sizes are determined under the microscope.

Preferably, the particles are present in the composition with a size of less than 50 µm.

The use of small particles permits a broader and more uniform distribution of the dye in the silicone. This results in a more uniform visual impression and also in a more constant absorption characteristic of a layer, which has been formed from the composition.

Dyes may be used which absorb radiation in the wavelength range of 400 nm to 700 nm without emitting a radiation in the longer-wave, visible range.

The composition may comprise at least one dye selected from: Solvent Yellow 179, Solvent Yellow 93, Solvent Yellow 114, Solvent Orange 60, Solvent Orange 107, Solvent Red 179, Solvent Red 135, Solvent Red 111, Solvent Red 195, Solvent Red 52, Solvent Violet 36, Solvent Violet 13, Solvent Blue 97, Solvent Blue 104, Solvent Green 3, Solvent Green 28.

A suitable selection of a dye or dye combination renders it possible to filter out the radiation of the entire wavelength range of 400 nm to 700 nm.

The composition may also comprise at least one dye from each one of the three groups I to III comprising:
I) Solvent Yellow 179, Solvent Yellow 93, Solvent Yellow 114, Solvent Orange 60, Solvent Orange 107, Solvent Red 179, Solvent Red 135, Solvent Red 111, Solvent Red 195, Solvent Red 52,
II) Solvent Violet 36, Solvent Violet 13, Solvent Blue 97, Solvent Blue 104,
III) Solvent Green 3, Solvent Green 28.

The table below indicates the corresponding CAS-numbers relating to the substances stated above:

| | |
|---|---|
| Solvent Yellow 179 | CAS 80748-21-6 |
| Solvent Yellow 93 | CAS 4702-90-3 |
| Solvent Yellow 114 | CAS 75216-45-4 |
| Solvent Orange 60 | CAS 61969-47-9 |
| Solvent Orange 107 | CAS 185766-20-5 |
| Solvent Red 179 | CAS 89106-94-5 |
| Solvent Red 135 | CAS 71902-17-5 |
| Solvent Red 111 | CAS 82-38-2 |
| Solvent Red 195 | CAS 164251-88-1 |
| Solvent Red 52 | CAS 81-39-0 |
| Solvent Violet 36 | CAS 61951-89-1 |
| Solvent Violet 13 | CAS 81-48-1 |
| Solvent Blue 97 | CAS 61969-44-6 |
| Solvent Blue 104 | CAS 116-75-6 |
| Solvent Green 3 | CAS 128-80-3 |
| Solvent Green 28 | CAS 71839-01-5 |

By virtue of the corresponding combination of the dyes, a sharp absorption edge can be achieved. This means that there is only a very narrow wavelength range between the wavelength range which is to be absorbed, i.e. filtered out, and the wavelength range for which a high level of transmission is sought. In this narrow wavelength range, the transmission behavior of the composition with respect to the radiation propagating through the composition should preferably increase rapidly, which means as sharply as possible, in a wavelength range of preferably no more than 50 nm, particularly preferably no more than 20 nm. The relative transmission should multiply, for example double, preferably triple, in this range.

Furthermore, the combination can provide effective absorption over the entire filter range. Individual dyes often have only effective absorption for a small wavelength range, whereas with the combination of several dyes, a very good filtering effect can be achieved for a range of for example 400 nm to 700 nm. Therefore, suitable selection of the dyes ensures that the relative transmission: can be maintained continuously below 10% for a wavelength range of this size.

The composition may comprise more than three of the dyes listed above in groups I to III.

An even larger number of dyes ensures that the wavelength range in which the radiation is absorbed, or the gradient of the absorption edge can be adjusted even more effectively and can thus be adapted more effectively to its intended use.

In addition to the organic dyes, the composition can also comprise inorganic dyes such as for example colored transition metal complexes such as Prussian blue, phthalocyanines with Cu, Zn, Co, Mg, Fe and metal-doped or metal-coated (Mn, Eu or nano-Al, nano-Au, nano-Ag, nano-TiN) silicates, aluminates, fluorides, oxides and glasses.

The dyes may be free of Pb and Cd.

The dyes may also be organometallic compounds such as for example Zn- or Cu-phthalocyanines.

The composition may comprise a dye concentration which is less than two percent by weight.

A higher concentration can reduce the transmissibility of the electromagnetic radiation in the range of greater than 700 nm and thus impair the optical function and required sensitivity in the transmitter or receiver region. Furthermore, a higher concentration can impair the uniform dye particle distribution in the composition in the case of a relative long storage time.

The silicone may be thermally curable in a range of 60° C. to 180° C. Preferably, the silicone is thermally curable in a range of 100° C. to 150° C.

The dye particles can be incorporated for example into a first silicone component, and these can then be thermally cured, together with a second silicone component.

The silicon may have a viscosity in the range of 100 mPas to 100000 mPas at room temperature. Preferably, the silicone has a viscosity in the range of 1000 mPas to 40000 mPas at room temperature.

Silicone of this viscosity has the advantage that it has a high degree of stability under storage, which means that the dye particles distributed in the silicone still have the same spatial distribution in the silicone even after a relatively long storage time and for example drop and accumulate at the bottom of the storage vessel to a considerably lesser extent, which would be the case for a silicone which has too low a viscosity. Whereas a silicone of higher viscosity can cause difficulties during processing, for example in an injection-molding process on account of increased toughness.

The composition may comprise a dialkyl silicone and/or an aromatic silicone.

The silicone can thus be a single-component silicone, i.e., a pure silicone, but can also be a two-component silicone. Also feasible are alternatives, in which the silicone comprises more than two components. The addition of aromatic silicones can for example serve to increase the refractive index of the silicone mixture and thus the refractive index of the composition.

In the case of a two-component silicone, the dye particles can, for example, only be incorporated into the first component before this is then mixed with the second component. However, the dye particles can also be incorporated into both components.

The refractive index can be varied by the use of for example silicones in which one or both alkyl groups are substituted by aromatic moieties, or in the case of silicone block polymers, consisting of dialkyl silicone blocks and regions having arylalkyl or diaryl main chain elements. Furthermore, the solvent resistance and permeation behavior and the adhesion resistance can be improved. The hardness and the E-modulus can also be increased.

The hydride functions and C—C-double bond functions to be crosslinked can be located for example at the respective chain ends or in the side groups.

The composition may have a refractive index in the range of 1.4 to 1.48.

The composition may have a refractive index of greater than 1.50, whereby the coupling losses are minimized at the transition of the electromagnetic radiation at the interface of the silicone and the chip.

The composition may have a refractive index in the range of 1.50 to 1.57.

The composition may comprise addition-curing silicones. This can be for example two components, wherein one of them comprises a C—C-double bond and the other comprises a hydride. Hydrosilylation can thus be effected between these two components. The advantage of this is that no addition by-products are formed during cross-linking.

The composition may be free of solvents.

By virtue of the fact that the dye can be dispersed directly in the silicone, it is possible in this case to omit the addition of solvents. This makes it possible to select the silicones irrespective of whether they could be attacked by a solvent which would have been used for solubilizing the dye. Likewise, during further use of the composition such as during application of the composition to a transparent substrate, the compatibility between a solvent and the substrate also does not have to be taken into account.

It is also not necessary to take into account any swelling or shrinkage phenomena during processing as well as any explosion-protection measures and harmful exposure of personnel due to critical workplace concentration values.

The composition does not need to comprise an epoxide. As a consequence, the composition is not encumbered by the disadvantages which have been discussed above in the comparison of silicone and epoxide.

With the exception of silicone, the composition does not need to comprise any further polymeric components. The composition can additionally also comprise a diffuser. The diffuser material can be selected for example from $CaF_2$, $SiO_2$, $BaSO_4$, $CaCO_3$, $Al_2O_3$, $TiO_2$, $ZrO_2$, ZnO. In the composition, the diffuser has a scattering effect with respect to the electromagnetic radiation and can thus increase the scattering thereof in the composition.

Furthermore, the composition can additionally also comprise a thickening agent such as for example pyrogenic silica. With the thickening agent, for example, viscosity of the composition can be adjusted, sedimentation and agglomeration behavior of the absorbing layer can be minimized and the desired filtering effect in the optical field can be made more homogeneous and optimized by scattering effects.

In addition to the composition, a material can be obtained by curing one of the previously described compositions.

The composition can be cured to form a component or a layer on for example a transparent substrate. The layer thickness in this case may be in a range of 1 µm to 2 mm, preferably in a range of 10 µm to 1 mm. If the layer thickness is selected to be too thin, then a high proportion of the radiation which should be filtered out by the layer, can pass through the layer. If the layer thickness is selected to be too thick, this may have the consequence that for example an excessively large proportion of the electromagnetic radiation which should not be filtered out by the layer, can be absorbed by the layer.

The layer can also have for example pattern structures such as pixel dots or stripes. Areas having a different layer thickness can also be formed.

The layer, which is formed, can be also be used for example to protect light-sensitive devices such as for example chip elements or array arrangements.

In addition to the composition itself, we also provide a method of producing the composition.

One method of producing a composition for a filter material comprises the steps of: providing a silicone as method step A), heating the silicone as method step B), adding to the silicone from B) a dye so that a dispersion is formed as method step C), mixing the dispersion from C) so that a mixture is formed as method step D), heating the mixture from D) as method step E), dispersing the mixture from E) so that a composition for a filter material is produced as method step F), wherein the composition has a relative transmission of less than 20% for radiation of the wavelength of 400 nm to 700 nm, and has a relative transmission of greater than 50% for radiation of the wavelength of 850 nm to 1025 nm.

In method step A), the dyes can be provided for example as a powder, pigment or granulated material. The starting materials are preferably placed into a vessel which is free of any S-containing and N-containing surface contaminants.

The silicone in method step B) is preferably heated to a temperature in the range of 35° C. to 40° C. This then allows the dye to be incorporated more easily.

The dispersion in method step D) can be effected for example with stirring devices, triple-roller mills or preferably with dissolver disks at 200 to 800 rpm at a temperature of 20° C. to 80° C. within a period of 1 to 8 hours or overnight. The mixture can also be mixed using a dissolver disk at 300 to 600 rpm or a Pendraulik agitator. This can occur for example over a period of one hour.

In method step E), heating can be performed in a furnace, for example, to a temperature of 60° C. to 80° C. Heating can be performed for example over a period of two hours.

The dispersion in method step F) can be performed for example over a period of two hours.

To further improve the distribution of dye in the silicone, the composition can be mixed in a mixer at 1600 to 2000 rpm. A SpeedMixer® can be used for this purpose. Mixing can be performed for example in two steps each lasting two minutes. Alternatively or in addition, homogenization can also be performed by a treatment with a triple-roller mill.

In the event that larger dye agglomerates are still present in the composition, they can be separated off for example by a filter process. This increases the homogeneity of the filter mass. For this purpose, it is possible to use a filter medium which does not release any substances to the composition which would impair or inhibit curing of the filter mass. For example, a filter can be used which filters out all of the dye agglomerates which are larger than 50 µm.

The maximum size of the particles or the dye agglomerates in the composition should not exceed 200 µm, preferably no 50 µm, particularly preferably not 20 µm.

The dispersion in method step D) can be mixed for example by an agitation or dispersing method, preferably by pearl mills, high-speed dissolvers (Ultra-Turrax), rolling methods or mixers (for example SpeedMixer®), wherein the mixers should reach a speed of 2000 rpm.

The speed of the corresponding apparatuses is selected preferably such that by the mechanical shearing forces introduced in the mixing or dispersing steps, the molecular structure of the silicone or the silicones is changed or damaged to the least possible extent by chain degradation reactions.

The mixing in method step D) is performed preferably at a temperature in the range of 20° C. to 80° C. In the case of a single-component silicone system, which is thermally curable, the mixing temperature preferably does not exceed 40° C.

In a further alternative of the method, the composition from F) is applied to a surface to form a layer. This occurs in the additional method step G).

Prior to application, a curing agent can first also be added to the composition.

The layer can have lateral patterns and a locally selective filter action.

The layer formed preferably has a layer thickness of 10 µm to 2 mm, particularly preferably 100 µm to 1 mm. Such a layer thickness achieves adequate absorption without absorbing an excessive portion of the electromagnetic radiation which is intended to pass through the layer.

The composition from method step F) can be applied in method step G) for example from the liquid phase by a dispenser or jetting. However, it also possible to use techniques such as for example screen printing, pad printing, spin coating, stamping, dipping or rolling. Specific geometric structures (dots, lines, surfaces) can also be produced using the screen printing or jet technology. Thus, it is for example also possible to coat specifically only partial regions of a substrate.

The applied layer can be cured for example at a temperature of 60° C. to 180° C., preferably at a temperature of 100° C. to 150° C. This can be performed for example in an in-line process, in which the layer is initially cured over a period of 15 minutes at 150° C. and is then post-cured in a post-curing process in a separate furnace at 150° C. for one hour, or in one step (batch process) for example for one hour at 150° C.

In a further method, the layer has the same absorption characteristic over its entire surface. This can be achieved by a uniform distribution of the dye in the silicone. The uniform distribution of the dye can be achieved by one of the previously described mixing techniques.

In addition to the material which can be obtained by curing of the composition, we also provide an optoelectronic device comprising a material of this kind.

We thus provide an optoelectronic device which emits or absorbs electromagnetic radiation of a wavelength from the wavelength range of 850 nm to 1025 nm. In this case, the device includes, in the beam path, a layer or a component comprising a material which is obtainable by the curing of the composition.

By virtue of the layer or the component, the electromagnetic radiation of the wavelength of 500 nm to 700 nm can be substantially filtered out without that a large portion of the electromagnetic radiation of the wavelength which is emitted or absorbed by the optoelectronic device being filtered out by the filter. Therefore, for example in the event that the optoelectronic device is a detector, the disturbing radiation from the wavelength range of 400 nm to 700 nm can be filtered out so that no undesired signal is generated in the detector by this radiation.

In a further optoelectronic device, the layer or the component is a daylight filter. The daylight filter can thus be used to protect the emitting or absorbing optical element from disturbing daylight.

In an optoelectronic device, the particles also function for example as scattering particles and thus increase for example the protection, which is acquired by light absorption, against disturbing signals from the ambient radiation caused by reflection effects, which means that the background noise or the signal-to-noise ratio and thus the detector quality are further improved. Accordingly, the near field and far field are optimized on the transmission side by particle scattering, in dependence upon the addition of dye and particle shape.

Alternatives will be described in more detail hereinafter with reference to the drawings and examples.

FIG. 1 illustrates a graph containing three transmission spectra a to c in which in each case the relative transmission ($S_{rel}$) in percent has been plotted against a wavelength ($\lambda$) of 400 nm to 1100 nm. 100 percent represents the maximum transmission achieved in this wavelength range which has been achieved for the respective curve.

A calibrated monochromator from the company Bentem was used as the radiation source for the measurements. As a receiver, a chip having a known degree of light-sensitivity was cast in a housing. The material to be measured in each case was used as the casting material.

Curve a shows the progression of the relative transmission for the pure silicone to which no dye has been added. Curve a rises, in the wavelength range of 400 nm to about 950 nm, steadily and approximately linearly, which means with the same slope. After reaching the relative transmission maximum at about 950 nm, the curve then falls steeply as a parabola until, in a wavelength range of 1100 nm, it reaches a value for the relative transmission of just under 20%.

Curve b illustrates the progression of the relative transmission for a composition $Z_b$. The composition $Z_b$ comprises a two-component silicone system (Shin Etsu KJR 9022 E1) in a proportion of 98.4 mass percent, an orange dye in a proportion of 0.08 mass percent, a violet dye in a proportion of 0.53 mass percent, a first green dye in a mass proportion of 0.20 mass percent, and a second green dye in a proportion of 0.19 mass percent.

As can be seen in FIG. 1, the composition $Z_b$ has virtually no transmission in the wavelength range of 400 nm to 700 nm. In the wavelength range of 750 nm to 900 nm, curve b rises steeply as a parabola and reaches its relative transmission maximum at a wavelength of about 950 nm. After passing through the maximum, the curve falls steeply as a parabola in a similar manner to curve a.

Curve c shows the relative transmission of the composition $Z_c$. The composition $Z_c$ comprises a two-component silicone system (Shin Etsu KJR 9022 E1) in a proportion of 98.2 mass percent, an orange dye in a proportion of 0.17 mass percent, a violet dye in a proportion of 1.06 mass percent, a first green dye in a proportion of 0.40 mass percent and a second green dye in a proportion of 0.37 mass percent.

Curve c has also practically no relative transmission from the wavelength range of 400 nm to 700 nm. In the wavelength range of 750 to 900 nm, curve c has a comparably steep gradient than curve b, but the progression of curve c is shifted slightly to higher wavelengths. Curve c also reaches its relative transmission maximum approximately at a wavelength of 950 nm and falls thereafter also steeply as a parabola like the other two curves.

It is apparent from FIG. 1 that addition of a suitable dye combination renders it possible in the wavelength range of 400 to 700 nm to achieve a highly effective filtering effect which is not achieved in the case of a pure silicone as shown by curve a. Both the composition $Z_b$ and the composition $Z_c$ have a steep absorption edge which can be identified by the steep slope in the two curves in the range of about 750 nm to 900 nm. As a result, the compositions $Z_b$ and $Z_c$ are highly suitable as for example daylight filters. They can be used for example for optoelectronic devices which operate with electromagnetic radiation from the wavelength range of for example 900 to 1000 nm.

Figure 2:
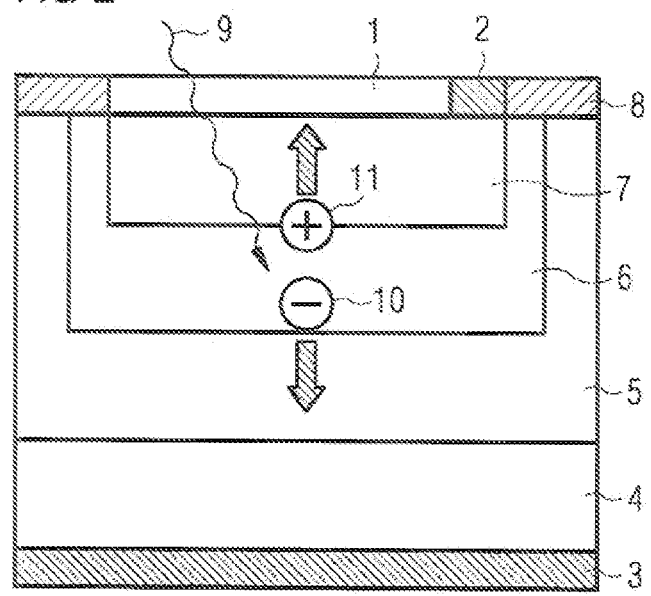
FIG. 2 shows a schematic side view of an example of the optoelectronic device which is formed as a photodiode.

FIG. 2 illustrates a schematic side view of an example of an optoelectronic device formed as a photodiode. This photodiode comprises a daylight filter 1 manufactured from a material as described in the application. The daylight filter 1 and the first electrical contact 2 are disposed on a highly p-doped zone 7. The highly p-doped zone 7 is surrounded at its lateral surfaces, and also from the underside, by a p-doped zone 6. This is followed in turn, towards the lateral surfaces and also towards the underside, by an n-doped zone 5. The n-doped zone 5 is placed on a highly n-doped zone 4 which in turn is disposed on a second electrical contact 3. The boundary regions of the upper side are provided with a dielectric 8. If electromagnetic radiation of a wavelength, which is not filtered by the daylight filter 1, then falls onto the surface of the daylight filter, the electromagnetic radiation, in this case illustrated for example as a photon 9 can pass through the daylight filter 1 and through the highly p-doped zone 7 to the p-doped zone 6. The energy of the photon 9 can here cause charge separation thus forming an electron 10 and a hole 11. The electron 10 or hole 11 can then migrate to the second electronic contact, or the first electronic contact of the device. The migration of the charge carriers produces a current flow in the device. The daylight filter 1 is able to prevent that photons pass into the interior of the photodiode by reason of the incidence of electromagnetic radiation, from the daylight wavelength range, and trigger there an undesired current flow and thus an undesired background signal in the photodiode by charge separation.

This disclosure is not restricted to the examples discussed herein. Rather, the disclosure encompasses any new feature and also any combination of features which in particular comprises any combination of features in the appended claims, even if the feature or the combination itself is not explicitly specified in the claims or examples.

The invention claimed is:

1. An optoelectronic device which emits or absorbs electromagnetic radiation of a wavelength from a wavelength range of 850 nm to 1025 nm in operation, comprising
    a layer or a component is arranged in a beam path of the device, the layer or the component is directly arranged on the optoelectronic device, the layer or the component comprises a material that filters radiation, and the material is obtained by curing a composition consisting of:
    a silicone block polymer consisting of dialkyl silicone blocks and regions having arylalkyl or diaryl main chain elements,
    wherein the silicone is thermally cured in a range of 60° C. to 180° C., and
    one or more dyes dispersed in the silicone, wherein the composition has a relative transmission of less than 20% for radiation of the wavelength between 400 nm to 700 nm, and a relative transmission of greater than 50% for radiation of the wavelength between 850 nm and 1025 nm at the thickness in a range of 1 µm to 2 mm, and
    wherein the composition is free of solvents.

2. The optoelectronic device according to claim 1, having a relative transmission of the composition which increases from less than 20% at 700 nm to greater than 50% at 850 nm, for radiation of the wavelength between 700 nm to 850 nm.

3. The optoelectronic device according to claim 1, wherein the dye is homogeneously distributed in the silicone.

4. The optoelectronic device according to claim 1, wherein the dye is present as particles of less than 200 µm.

5. The optoelectronic device according to claim 1, wherein the at least one dye is selected from the group consisting of Solvent Yellow 179, Solvent Yellow 93, Solvent Yellow 114, Solvent Orange 60, Solvent Orange 107, Solvent Red 179, Solvent Red 135, Solvent Red 111, Solvent Red 195, Solvent Red 52, Solvent Violet 36, Solvent Violet 13, Solvent Blue 97, Solvent Blue 104, Solvent Green 3 and Solvent Green 28.

6. The optoelectronic device according to claim 5, wherein the at least one dye comprises one dye from each of groups I to III:
    I) Solvent Yellow 179, Solvent Yellow 93, Solvent Yellow 114, Solvent Orange 60, Solvent Orange 107, Solvent Red 179, Solvent Red 135, Solvent Red 111, Solvent Red 195 and Solvent Red 52,
    II) Solvent Violet 36, Solvent Violet 13, Solvent Blue 97 and Solvent Blue 104,
    III) Solvent Green 3 and Solvent Green 28.

7. The optoelectronic device according to claim 1, wherein the layer or the component is a daylight filter.

8. The optoelectronic device according to claim 1, further comprises: a first electrical contact and a dielectric, and wherein the layer or the component together with the first electrical contact and the dielectric are arranged side by side and in one plane to each other.

9. The optoelectronic device according to claim 1, wherein the optoelectronic device is a photodiode, the layer or the component and a first electrical contact are disposed on a highly first p-doped zone, the first p-doped zone is surrounded at its lateral surfaces, and also from the underside, by a second p-doped zone, the second p-doped zone is surrounded at its lateral surfaces and also toward the underside, by a first n-doped zone, the first n-doped zone is placed on a highly second n-doped zone, and the highly second n-doped zone is disposed on a second electrical contact.

\* \* \* \* \*